United States Patent
Koyuncu et al.

(10) Patent No.: US 10,298,230 B2
(45) Date of Patent: May 21, 2019

(54) INDUCTIVE PROXIMITY SENSOR OF INTEGRATED DESIGN

(71) Applicant: Balluff GmbH, Neuhausen a.d.F. (DE)

(72) Inventors: Uemit Koyuncu, Ostfildern (DE); Joerg Gross, Stuttgart (DE); Mario Pribil, Stuttgart (DE)

(73) Assignee: Balluff GmbH, Neuhausen a.d.F. (DE)

( * ) Notice: Subject to any disclaimer, the term of this patent is extended or adjusted under 35 U.S.C. 154(b) by 0 days.

(21) Appl. No.: 15/505,335

(22) PCT Filed: Aug. 22, 2014

(86) PCT No.: PCT/DE2014/100299
§ 371 (c)(1),
(2) Date: Feb. 21, 2017

(87) PCT Pub. No.: WO2016/026476
PCT Pub. Date: Feb. 25, 2016

(65) Prior Publication Data
US 2017/0272071 A1 Sep. 21, 2017

(51) Int. Cl.
*G01V 3/10* (2006.01)
*H01F 27/28* (2006.01)
(Continued)

(52) U.S. Cl.
CPC ......... *H03K 17/9505* (2013.01); *G01V 3/10* (2013.01); *H01F 27/2804* (2013.01);
(Continued)

(58) Field of Classification Search
CPC ........... H03K 17/9505; H03K 17/952; H03K 17/945; H03K 17/9525; H03K 17/954;
(Continued)

(56) References Cited

U.S. PATENT DOCUMENTS 3,701,086 A * 10/1972 Somerset ............ H01R 24/562
174/75 C
4,042,876 A * 8/1977 Visioli, Jr. ............ G01D 5/202
324/207.16
(Continued)

FOREIGN PATENT DOCUMENTS

DE       100 48 290 A1   5/2002
DE   10 2006 040 550 A1   3/2007
(Continued)

OTHER PUBLICATIONS

English machine translation of Gross WO 2012/113361.*
International Search Report of PCT/DE2014/100299, dated Apr. 30, 2015.

*Primary Examiner* — Lee E Rodak
(74) *Attorney, Agent, or Firm* — Collard & Roe, P.C.

(57) ABSTRACT

A front end for an inductive proximity sensor includes a coil for detecting an approaching metal object and a circuit board, wherein the coil is designed as a circuit board coil disposed in the circuit board, wherein a metal influencing element which is disposed in or on the circuit board has an opening to receive at least one electrical connecting element, wherein a through connection of the circuit board to an electrical connection plane, which serves for electrical connection of the circuit board to a control electronics of the proximity sensor, is made by the at least one electrical connecting element.

18 Claims, 5 Drawing Sheets

(51) Int. Cl.
*H01F 27/32* (2006.01)
*H03K 17/95* (2006.01)
*H05K 1/16* (2006.01)

(52) U.S. Cl.
CPC ......... *H01F 27/324* (2013.01); *H03K 17/952* (2013.01); *H05K 1/165* (2013.01); *H03K 2017/9527* (2013.01); *H05K 2201/10151* (2013.01)

(58) Field of Classification Search
CPC ........... H03K 17/9502; H03K 17/9535; H03K 2017/9527; H03K 2017/9455; H03K 2217/94021; H03K 2217/952; H03K 2217/958; H03K 2217/96072; G01D 11/245; G01D 5/2006; G01D 5/202; G01D 5/04; G01D 5/06; G01D 5/20; G01D 5/2013; G01D 5/204; G01D 5/2053; G01D 5/2066; G01D 5/2086; Y10T 29/4902; Y10T 29/49007; G01B 7/023; G01B 7/14; G01B 7/001; G01B 7/003; G01B 7/30; G01V 3/10; G01V 3/102; G01V 3/104; G01V 3/15; H05K 1/165; H05K 2201/10151; F16C 29/00; H01F 17/0013; H01F 27/2804; H01F 27/324
See application file for complete search history.

(56) References Cited

U.S. PATENT DOCUMENTS

| | | | |
|---|---|---|---|
| 5,461,353 A | 10/1995 | Eberhardt | |
| 5,863,445 A | 1/1999 | Geisel et al. | |
| 6,545,464 B1* | 4/2003 | Tigges | H03K 17/9505 324/207.12 |
| 7,825,655 B1* | 11/2010 | Stabel | G01B 7/14 324/207.15 |
| 8,981,767 B2* | 3/2015 | Mahler | G01D 11/245 324/207.15 |
| 2002/0039023 A1* | 4/2002 | Jagiella | G01B 7/001 324/207.26 |
| 2003/0071708 A1* | 4/2003 | Schmidt | G01V 3/104 336/220 |
| 2008/0204118 A1 | 8/2008 | Kuhn | |
| 2008/0211489 A1* | 9/2008 | Reusing | F16C 29/00 324/207.16 |
| 2011/0285406 A1* | 11/2011 | Reetmeyer | G01D 5/20 324/654 |
| 2013/0120003 A1* | 5/2013 | Sheikman | F02C 9/00 324/637 |
| 2016/0209240 A1* | 7/2016 | Pfaffinger | G01D 5/2033 |

FOREIGN PATENT DOCUMENTS

| | | |
|---|---|---|
| EP | 0 581 206 A2 | 2/1994 |
| JP | S59-190717 A | 10/1984 |
| WO | WO2012/113361 * | 8/2012 |

* cited by examiner

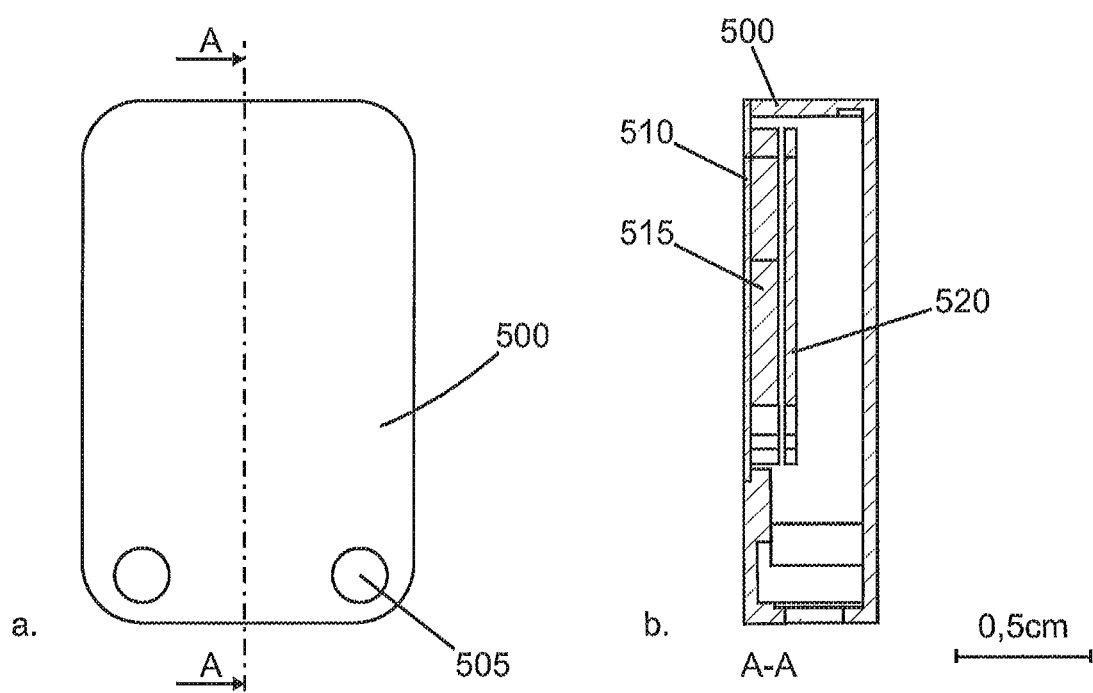
Fig. 5 a,b

INDUCTIVE PROXIMITY SENSOR OF INTEGRATED DESIGN

CROSS REFERENCE TO RELATED APPLICATIONS

This application is the National Stage of PCT/DE2014/100299 filed on Aug. 22, 2014, the disclosure of which is incorporated by reference. The international application under PCT article 21(2) was not published in English.

The invention is based on a front end for an inductive proximity sensor or proximity switch and an inductive proximity sensor or proximity switch having such a front end, according to the type of the independent claims.

PRIOR ART

Inductive proximity sensors or proximity switches which, in contrast to mechanically activated, contact-based electric switching devices, work in a touch-free or contactless manner, are known in the field of measuring and control technology.

Such a proximity switch is known from DE 10 2006 040 550 A1, with which it is possible to detect whether an electrically conductive, generally a metal object has advanced close enough to the proximity switch. In this case, an electronic switch that belongs to an evaluation circuit is reversed, wherein, in the case of a proximity switch implemented as an N/O contact, the previously non-conductive electronic switch becomes conductive, whereas, in the case of a proximity switch implemented as a N/C contact, the previously conductive electronic switch henceforth closes.

If said metal object advances close enough to such an inductive proximity switch, an oscillator having an oscillating circuit coil reverse said electronic switch in said manner. By doing so, an alternating current of around 200 kHz flows in the oscillating circuit coil. The alternating current constructs an electromagnetic alternating field in the surroundings of the oscillating circuit coil. If said electrically conductive object ("target"), in most cases a metal vane, is introduced into this alternating field, eddy currents are then induced in it according to the law of induction. Thus, electric energy is removed from the current circuit of the oscillator, to which the oscillating circuit coil belongs, or it is damped, whereby the oscillations of the oscillator subside or the oscillator, as the case may be, even stops oscillating completely.

Furthermore, an inductive proximity sensor results from DE 100 48 290 A1 that comprises a sensor coil formed in the shape of a structured conducting layer of a carrier board and an evaluation circuit, which is connected to the sensor coil and has a circuit board provided with conductor tracks. In particular, it is provided with this sensor that the circuit board and the carrier board run transversely to each other and at least one coil is formed by a structured, electrically conductive layer of the circuit board and is integrated into the circuit board in the form of conductor tracks.

It is further provided with this known proximity sensor that the carrier board carrying the sensor coil is connected mechanically rigidly and electrically to the circuit board by means of two soldering connections, by means of which the sensor coil is, in turn, electrically connected to the circuit board and at the same time a mechanical connection of the sensor coil and circuit board is created. Thus, the sensor coil and the circuit board form a mutually manageable unit that is able to be inserted as a unit into the housing in the further finishing process.

DISCLOSURE OF THE INVENTION

The object of the invention is to make a front end concerned here for an inductive proximity switch, i.e. a metal front face (=front end) arranged towards the sensing region of the proximity sensor, or a proximity sensor or proximity switch formed from such a front end, that is able to be produced more cost effectively compared to the prior art, however retaining the required precision or sensitivity when detecting said approaching objects.

With an inductive proximity sensor or switch concerned here, the invention in particular suggests enabling a specifically integrated construction of the front end by using a circuit board coil ("print coil" in the following). Thus in particular a metal influencing element that is as far as possible identical in terms of construction to the front end or the metal front is arranged, by means of which the disruption of the symmetry with respect to the position and material properties caused by the metal front is corrected. The influencing element is preferably arranged to be integrated in a corresponding circuit board and has an opening to receive at least one electric connection element, wherein a through contact of the circuit board to an electric connection plane, which preferably serves to electrically connect the circuit board to the control electronics, takes place by means of this connecting element. In terms of the circuit board with the integrated coil arrangement according to the invention, the influencing element is preferably opposing the front end.

A front-end system according to the invention of a proximity sensor or switch concerned here can thus be advantageously formed as part of a correspondingly integrated sensor housing front, in particular a metal housing.

The invention enables contacting a front-end circuit board concerned here by said metal influencing element with as small a decrease in size of the surface as possible, or even by maximising the surface of the influencing element in order to obtain as substantial sensor properties of the influencing element as possible and to change or disturb these properties as little as possible by contacting.

In comparison to other inherently known approaches to the solution, e.g. using circuit boards with a so-called "flex-rigid" connection, the invention has the advantage that it is able to be produced substantially more cost-effectively, since it does not require a special attachment of the influencing element and enables a relatively symmetrical influencing element with a large surface.

A front end according to the invention for an inductive proximity sensor or switch and an inductive sensor or switch having such a front end is suitable for touch-free or contactless detection of approaching metal objects, in particular in electric and electronic switching, measuring, control and regulating circuits, having the advantages described herein.

SHORT DESCRIPTION OF THE FIGURES

FIG. 5a, b show a top view (a.) and a lateral sectional view (b.) of a metal housing having a front end according to the invention, according to a second exemplary embodiment.

DETAILED DESCRIPTION OF THE EXEMPLARY EMBODIMENTS

Figure 1:
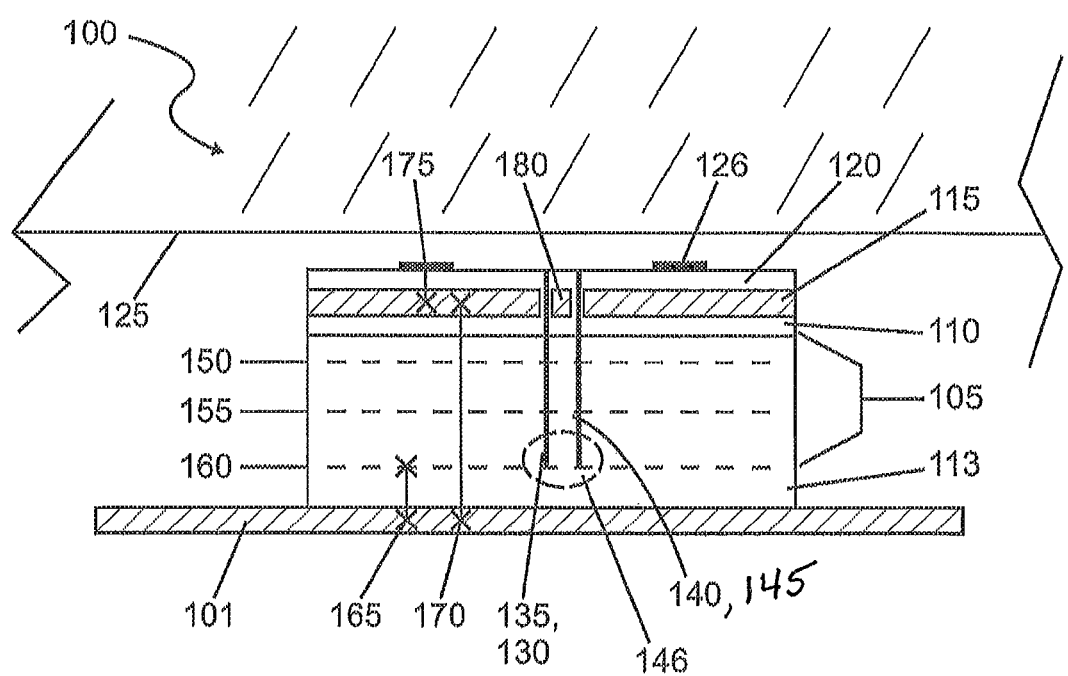
FIG. 1 shows a schematic lateral view of a front end according to the invention for an inductive proximity sensor or switch.

The front end 100 shown in FIG. 1 comprises a circuit board 105 applied to a metal sheet 101. A metal influencing element 115 that is covered by a first prepreg layer 110 is arranged on the side of the circuit board 105 opposing the metal sheet 101. A second prepreg layer 113 is arranged on the transition side of the circuit board 105 to the metal sheet 101 in this exemplary embodiment. The material "prepreg" is a glass fibre fabric, as is known, which is impregnated with epoxy resin. Electric contact surfaces (126, 226-229, 326-329) are arranged on this side of the circuit board 105 which serve to electrically connect the front end 100 to an electronic assembly group (125) of the proximity sensor or proximity switch. It should be noted that the connection plane 120 can similarly be formed from prepreg. In this case, said electric contact surfaces are arranged on the connection plane 120.

A recess 180 is arranged in the influencing element 115, said recess being filled with an electric insulator, resin in this case. The recess 180 enables the arrangement of a through contact, which is subsequently described, of the connection plane 120 to the circuit board 105, by means of at least one via (via=vertical interconnect access) 135, 140.

In the exemplary embodiment, the circuit board 105 is formed to have many layers and has several (in this case three) conductor track planes 150, 155, 160, wherein a circuit board coil ("print coil") that cannot be seen in this depiction is arranged in the third conductor track plane 160. To operate this print coil, vias 135, 140 arranged or ending in a region 146 shown dashed of the third conductor track plane 160 are provided with the connection plane 120 or contact surfaces (or "soldering pads") 126 arranged there. It should be noted that every conductor track plane can be a print coil. The through contact by means of the vias 130-145 connect these layers among themselves. In addition, the vias also connect the electric contact surfaces, e.g. according to reference numeral 126, to the conductor track planes or the circuit board 105.

Figure 2:
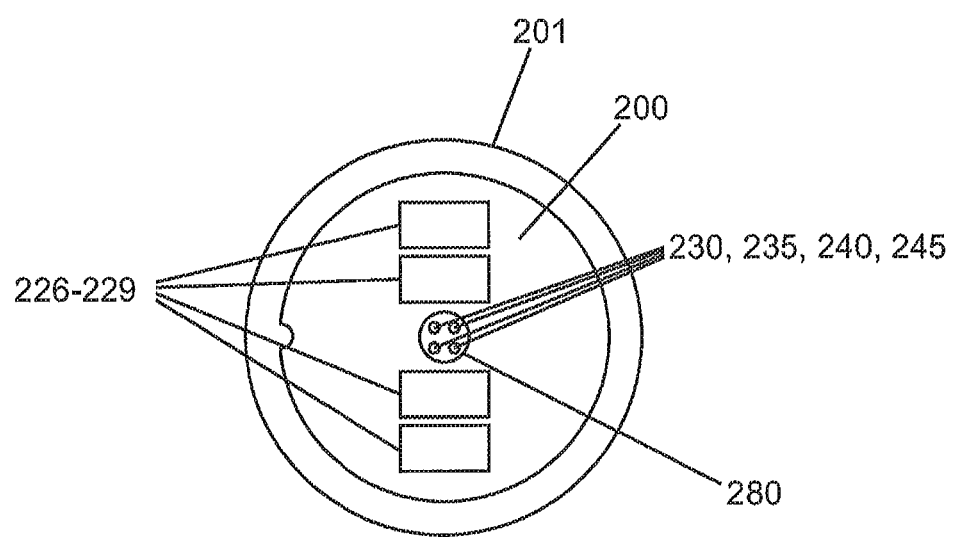
FIG. 2 shows a schematic top view of a first exemplary embodiment of a circuit board according to the invention for a front end shown in FIG. 1.

The metal sheet 101 and the influencing element 115 can additionally be connected to the print coil and/or the connection plane 120 via further vias 165, 175, wherein, according to FIG. 2, at least one continuous contact or conductor 230, 235, 240, 245 can be provided. Additionally or alternatively, it can be provided to connect the influencing element 115 to the metal sheet 101 by means of a via 170.

It should be noted that the circuit board 105 provided with the influencing element 115, the prepreg layers 110, 113 and the connection plane 120 present a function or construction unit that is able to be marketed separately.

The presently round front end 200 shown in a top view in FIG. 2 comprises, in the present exemplary embodiment, four electric contact surfaces (so-called "soldering pads") 226, 227, 228, 229 for solder-connecting receiving of the electronic assembly group (125) and a recess 280 arranged in the influencing element, said recess 280 being filled with resin. In the exemplary embodiment, the recess 280 has four regions for vias 230, 235, 240, 245, i.e. contact holes for through contact of individual metallisation planes. In particular, these contact holes 230-245 are used for the through contacting of the print coil (not shown) to a connection plane shown in FIG. 1.

It should be noted that the circuit board, depending on usage, can also be formed to be quadratic or rectangular, since in this case it does not depend on the external shape.

Figure 3:
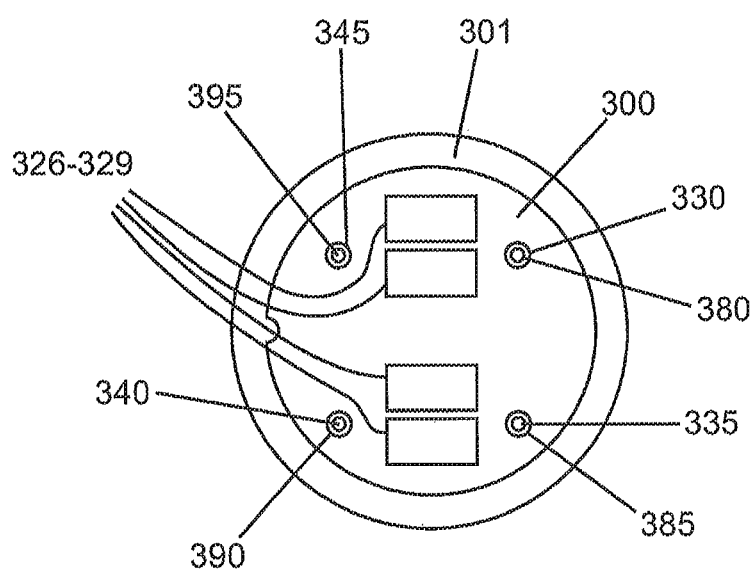
FIG. 3 shows a schematic top view of a second exemplary embodiment of a circuit board according to the invention for a front end shown in FIG. 1.

In this exemplary embodiment, the front end 300 also depicted in a top view in FIG. 3 comprises, in turn, four electric contact surfaces 326, 327, 328, 329 for the above-mentioned purpose. In comparison to FIG. 2, four recesses 330, 335, 340, 345 are arranged in the influencing element (which cannot be seen in this depiction). Each of these recesses 330-345 comprises one region 380, 385, 390, 395 for said via, and indeed in turn for through contacting the print coil.

Figure 4:
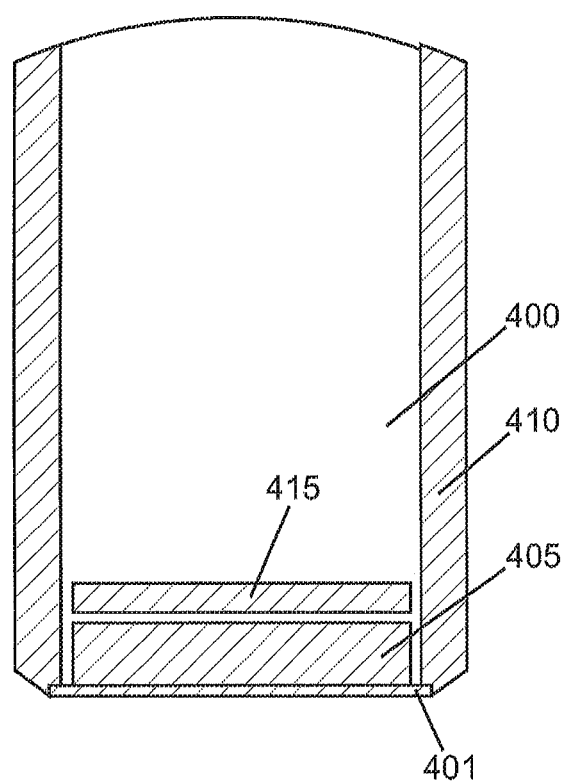
FIG. 4 shows a lateral sectional view of a metal housing having a front end according to the invention, according to a first exemplary embodiment.

A described front end can, as shown in FIG. 4, be integrated into a metal housing 410 and is thus protected against any external influences such that it is also able to be safely used in chemically aggressive environments, for example. In this exemplary embodiment, the circuit board 405 that is in turn arranged to be substantially firmly bonded to a metal sheet 401 is arranged on the bottom end of the metal housing 410 according to the view in FIG. 4. The metal sheet 401 depicts said metal front face of a front end concerned here. The arrangement of an influencing element 415 that has already been described is also schematically depicted in FIG. 4.

FIGS. 5a and 5b show a second exemplary embodiment of a front end integrated into a metal housing 500. The two indentations or holes 505 serve as mounting aids. The sectional view shown in FIG. 5b emerges, according to FIG. 5a, through a cut along the line A-A. In the metal housing 500, a described circuit board 515 is arranged to be substantially firmly bonded directly to a front face 510 as part of the whole housing 500. An influencing element 520 already described is also schematically drawn in FIG. 5b.

In the production of a circuit board 105, 405, 515 previously described, similar to in the inherently known technology of "Insulated Metal Substrate" (IMS), a metal sheet serving as said influencing element is incorporated into the finishing of the print coil. This sheet is arranged between two said prepreg layers and enables the generation of a through contacting previously described. In contrast to prior art, only one relatively small hole has to be introduced (e.g. drilled) into the influencing element to do this. As a result, a relatively space-saving contacting between the print coil and the connection plan is obtained.

In the following a preferred method for producing a front end according to the invention of an inductive proximity sensor or switch is described. Initially, a multi-layered, and indeed at least two-layered, print coil is produced on the circuit board in an inherently known manner. Then, the adhesive surfaces between the circuit board and the influencing element are prepared for the subsequent adhesion process, where applicable including one or more cleaning steps. The adhesive partners of the adhesive process are a prepreg layer described and a metal sheet described. Then, the circuit board is joined or pressed to the influencing element under pressure or temperature by introducing a prepreg, for example. This completion takes place by an inherently known process in circuit board finishing, wherein the hole present in the influencing element is filled up with resin. At the same time, pressing of a further prepreg layer takes place. Subsequently, drilling, structuring and galvanising including through contacting of the front end and the final layer takes place, however without the metal sheet 101. Finally, the part packet formed in such a way is pressed to a further prepreg layer by the metal sheet 101.

The contacting plane is correspondingly produced, wherein the circuit board is pressed to the influencing element and said prepreg layer.

LIST OF REFERENCE NUMERALS

101 Metal sheet
100 Front end
105 Circuit board
110, 113 Prepreg layers
115 Influencing element
120 Connection plane
125 Electronic assembly group
126 Electric contact surfaces
180 Recess
130-145 Vias
146 Region of the third conductor track plane
150-160 Conductor track planes
165-175 Vias
200 Front end
201 Metal sheet
226-229 Electric contact surfaces
280 Recess
230-245 Vias
300 Front end
301 Metal sheet
326-329 Electric contact surfaces
380-395 Recesses
330-345 Vias
400 Front end
401 Metal sheet
410 Metal housing
415 Influencing element
500 Metal housing
505 Indentations
510 Front face
515 Circuit board
520 Influencing element

The invention claimed is:

1. A front end for an inductive proximity sensor, the front end comprising:
    a circuit board;
    a metallic sheet disposed in front of the circuit board;
    a coil for detecting an approaching metal object, wherein the coil is formed as a circuit board coil arranged in the circuit board;
    a first prepreg layer disposed behind the circuit board;
    an influencing sheet which is metallic and is designed structurally similar to the metallic sheet, wherein the influencing sheet is arranged on the first prepreg layer and provides at least one opening;
    an electric connection plane configured to electrically connect the front end to a control electronics of the proximity sensor, the electric connection plane comprising a second prepreg layer disposed on the influencing sheet; and
    at least one electric connection element connecting the circuit board to the electric connection plane and running through the at least one opening of the influencing sheet;
    wherein the metallic sheet is configured to allow magnetic fields to pass through the metallic sheet thereby inducing eddy currents in the approaching metal object.

2. The front end according to claim 1, wherein the coil is arranged in an insulator.

3. The front end according to claim 1, wherein the first prepreg layer and the second prepreg layer electrically insulate the influencing sheet.

4. The front end according to claim 1, further comprising an electric contact surface on the second prepreg layer and configured to electrically connect the front end to an electronic assembly group.

5. An assembly comprising:
    the front end according to claim 4, and
    an electronic assembly group mechanically fixed to the front end and electrically connected to the electric contact surface.

6. The front end according to claim 4, wherein the electric connection plane has at least one soldering pad for solder-connecting the electronic assembly group.

7. The front end according to claim 6, wherein the second prepreg layer has a first side connected to the influencing sheet and a second side facing away from the influencing sheet; and
    wherein the at least one soldering pad is disposed on the second side of the second prepreg layer such that the at least one soldering pad faces away from the influencing sheet.

8. The front end according to claim 1, wherein the at least one electric connection plane comprises at least one via;
    wherein the circuit board comprises at least one contact hole; and
    wherein the at least one electric connection element runs through the at least one contact hole of the circuit board and through the at least one via of the electric connection plane.

9. The front end according to claim 1, further comprising at least one via,
    wherein the at least one via electrically connects the metallic sheet to the circuit board coil in the circuit board.

10. The front end according to claim 1, further comprising at least one via,
    wherein the at least one via connects and through contacts the metallic sheet to the influencing sheet.

11. An inductive proximity sensor comprising a front end according to claim 1.

12. The inductive proximity sensor according to claim 11, further comprising control electronics;
    wherein the control electronics are electrically connected to the circuit board through the influencing sheet.

13. An inductive proximity switch comprising a front end according to claim 1.

14. The front end according to claim 1, further comprising a third prepreg layer, the third prepreg layer connecting the metallic sheet to the circuit board.

15. An assembly comprising:
    a front end according to claim 1; and
    a metal housing having an open end;
    wherein the metallic sheet of the front end is inserted into the open end and bonded to the metal housing thereby forming an enclosed space.

16. The front end according to claim 1, wherein the front end forms a modular unit configured to be integrated into and connected to a metal housing.

17. The front end according to claim 1, wherein the metallic sheet has a first thickness; and wherein the influencing sheet has a second thickness equal to the first thickness.

18. A method for forming a front end for an inductive proximity sensor, the method comprising:
- providing a circuit board, the circuit board comprising a circuit board coil, a first side, and a second side disposed opposite to the first side, the circuit board coil being arranged in the circuit board;
- adhering an influencing sheet to the circuit board on the second side of the circuit board by disposing a prepreg layer between the circuit board and the influencing sheet, the influencing sheet being metallic and having at least one opening, the at least one opening being filled with resin via the adhering;
- through contacting at least one electric connection element from the circuit board coil and through the circuit board and the influencing sheet, the at least one electric connection element running through the at least one opening; and
- adhering a metallic sheet to the first side of the circuit board.

* * * * *